(12) United States Patent
Bombardier et al.

(10) Patent No.: US 10,199,270 B2
(45) Date of Patent: Feb. 5, 2019

(54) MULTI-DIRECTIONAL SELF-ALIGNED MULTIPLE PATTERNING

(71) Applicant: GLOBALFOUNDRIES Inc., Grand Cayman (KY)

(72) Inventors: Colin Bombardier, Clifton Park, NY (US); Ming He, Saratoga Springs, NY (US); Vikrant Chauhan, Cohoes, NY (US); Anbu Selvam KM Mahalingam, Mechanicville, NY (US); Keith Donegan, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/605,327

(22) Filed: May 25, 2017

(65) Prior Publication Data

US 2018/0342421 A1 Nov. 29, 2018

(51) Int. Cl.
| | |
|---|---|
| *H01L 21/768* | (2006.01) |
| *H01L 21/66* | (2006.01) |
| *H01L 23/522* | (2006.01) |
| *H01L 23/528* | (2006.01) |

(52) U.S. Cl.
CPC .. *H01L 21/76897* (2013.01); *H01L 21/76816* (2013.01); *H01L 22/32* (2013.01); *H01L 23/528* (2013.01); *H01L 23/5226* (2013.01)

(58) Field of Classification Search
None
See application file for complete search history.

(56) References Cited

U.S. PATENT DOCUMENTS

| | | | | |
|---|---|---|---|---|
| 8,298,943 | B1 * | 10/2012 | Arnold | H01L 21/0337 438/667 |
| 8,802,451 | B2 * | 8/2014 | Malmhall | B82Y 10/00 257/295 |
| 8,916,475 | B1 * | 12/2014 | Chen | H01L 21/3085 438/700 |
| 8,999,848 | B2 * | 4/2015 | Lee | H01L 21/4846 257/E21.039 |
| 9,023,731 | B2 * | 5/2015 | Ji | H01L 21/02115 438/703 |
| 9,040,422 | B2 | 5/2015 | Wang et al. | |

(Continued)

FOREIGN PATENT DOCUMENTS

| | | |
|---|---|---|
| WO | 2007038702 A1 | 4/2007 |
| WO | 2007038725 A2 | 4/2007 |

OTHER PUBLICATIONS

Non-Final Rejection of U.S. Appl. No. 15/077,564 dated Oct. 18, 2016.*

(Continued)

*Primary Examiner* — Telly Green
(74) *Attorney, Agent, or Firm* — Thompson Hine LLP; Anthony Canale

(57) ABSTRACT

Interconnect structures and methods of fabricating an interconnect structure. First and second non-mandrel interconnects are formed in an interlayer dielectric layer. The first non-mandrel interconnect and the second non-mandrel interconnect have respective side surfaces that extend in a first direction. The connector interconnect extends in a second direction transverse to the first direction from the side surface of the first non-mandrel interconnect to the side surface of the second non-mandrel interconnect.

20 Claims, 3 Drawing Sheets

(56) References Cited

U.S. PATENT DOCUMENTS

| | | | |
|---|---|---|---|
| 9,070,753 B1* | 6/2015 | Lee | H01L 21/76877 |
| 9,123,656 B1* | 9/2015 | Hsieh | H01L 21/3086 |
| 9,478,433 B1* | 10/2016 | Zhou | H01L 21/0337 |
| 9,530,701 B2* | 12/2016 | Cheng | H01L 21/823468 |
| 9,548,201 B2* | 1/2017 | Zhang | H01L 21/0332 |
| 9,679,809 B1* | 6/2017 | Kye | H01L 21/31111 |
| 9,691,626 B1* | 6/2017 | Bouche | H01L 21/3081 |
| 9,691,775 B1* | 6/2017 | Licausi | H01L 27/1104 |
| 9,698,015 B2* | 7/2017 | Nemani | H01L 21/0337 |
| 9,728,406 B2* | 8/2017 | Dai | H01L 21/0337 |
| 9,773,643 B1* | 9/2017 | Singhal | H01J 37/32091 |
| 9,778,561 B2* | 10/2017 | Marks | G03F 1/76 |
| 9,779,943 B2* | 10/2017 | Bouche | H01L 21/0338 |
| 9,786,545 B1* | 10/2017 | Bouche | H01L 21/76224 |
| 9,793,110 B2* | 10/2017 | Kang | H01L 21/022 |
| 9,812,351 B1* | 11/2017 | Licausi | H01L 21/76816 |
| 9,818,621 B2* | 11/2017 | Tavernier | H01L 21/31116 |
| 9,818,623 B2* | 11/2017 | Stephens | H01L 21/0337 |
| 9,818,640 B1* | 11/2017 | Stephens | H01L 21/76816 |
| 9,818,641 B1* | 11/2017 | Bouche | H01L 21/76816 |
| 9,852,986 B1* | 12/2017 | Stephens | H01L 23/528 |
| 9,859,120 B1* | 1/2018 | Sun | H01L 21/0338 |
| 9,865,815 B2* | 1/2018 | Hausmann | H01L 45/16 |
| 9,875,891 B2* | 1/2018 | Henri | H01L 21/0228 |
| 9,887,127 B1* | 2/2018 | Licausi | H01L 21/76816 |
| 9,892,917 B2* | 2/2018 | Swaminathan | H01L 21/0337 |
| 9,911,659 B2* | 3/2018 | Lee | H01L 21/82348 |
| 9,916,986 B2* | 3/2018 | Briggs | H01L 21/3065 |
| 2013/0244344 A1* | 9/2013 | Malmhall | B82Y 10/00 438/3 |
| 2014/0170853 A1* | 6/2014 | Shamma | H01L 21/02115 438/699 |
| 2014/0273464 A1* | 9/2014 | Shieh | H01L 21/823431 438/700 |
| 2015/0140811 A1* | 5/2015 | Huang | H01L 21/3086 438/669 |
| 2015/0318173 A1* | 11/2015 | Shih | H01L 21/0338 438/702 |
| 2016/0049307 A1* | 2/2016 | Chen | H01L 21/0337 438/696 |
| 2016/0056075 A1* | 2/2016 | Wei | H01L 21/76877 438/618 |
| 2016/0056104 A1* | 2/2016 | Bouche | H01L 23/528 257/741 |

OTHER PUBLICATIONS

Stephens et al., "Method of Forming a Pattern for Interconnection Lines and Associated continuity Blocks in an Integrated Circuit", U.S. Appl. No. 15/077,480, filed Mar. 22, 2016.

* cited by examiner

MULTI-DIRECTIONAL SELF-ALIGNED MULTIPLE PATTERNING

BACKGROUND

The present invention relates to integrated circuits and semiconductor device fabrication and, more specifically, to interconnect structures and methods of fabricating an interconnect structure.

A back-end-of-line (BEOL) interconnect structure may be used to connect device structures fabricated on a substrate during front-end-of-line (FEOL) processing with each other and with the environment external to the chip. Self-aligned patterning processes used to form a BEOL interconnect structure involve mandrels as sacrificial features that establish a feature pitch. Sidewall spacers, which have a smaller thickness than permitted by the current ground rules for optical lithography, are formed adjacent to the vertical sidewalls of the mandrels. After selective removal of the mandrels, the sidewall spacers are used as an etch mask to etch an underlying hardmask, for example, with a directional reactive ion etch (RIE) process. Unmasked features in the pattern are transferred from the hardmask to a dielectric layer to define trenches in which the wires of the BEOL interconnect structure are formed.

Cuts may be formed in mandrels with a cut mask and etching in order to section the mandrels and define gaps that may be subsequently used to produce wires that are spaced apart at their tips with a tip-to-tip spacing. A pattern reflecting the cut mandrels may be transferred to the hardmask and subsequently from the hardmask to the patterned interlayer dielectric layer. Non-mandrel cuts may also be formed in the hardmask itself and define gaps that may be filled by dielectric material when the sidewall spacers are formed. The filled gaps may be subsequently used to produce wires in the patterned interlayer dielectric layer that are spaced apart at their tips with a tip-to-tip spacing.

Improved interconnect structures and methods of fabricating an interconnect structure are needed.

SUMMARY

In an embodiment of the invention, a self-aligned multi-patterning structure includes an interlayer dielectric layer, a first non-mandrel interconnect embedded in the interlayer dielectric layer, a second non-mandrel interconnect embedded in the interlayer dielectric layer, and a connector interconnect. The first non-mandrel interconnect and the second non-mandrel interconnect have respective side surfaces that extend in a first direction. The connector interconnect extends in a second direction transverse to the first direction from the side surface of the first non-mandrel interconnect to the side surface of the second non-mandrel interconnect.

In an embodiment of the invention, a method is provided for forming a self-aligned multi-patterning structure. The method includes forming a first non-mandrel interconnect and a second non-mandrel interconnect in an interlayer dielectric layer. The first non-mandrel interconnect and the second non-mandrel interconnect have respective side surfaces that extend in a first direction. The method further includes forming a connector interconnect in the interlayer dielectric layer that extends in a second direction transverse to the first direction from the side surface of the first non-mandrel interconnect to the side surface of the second non-mandrel interconnect.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
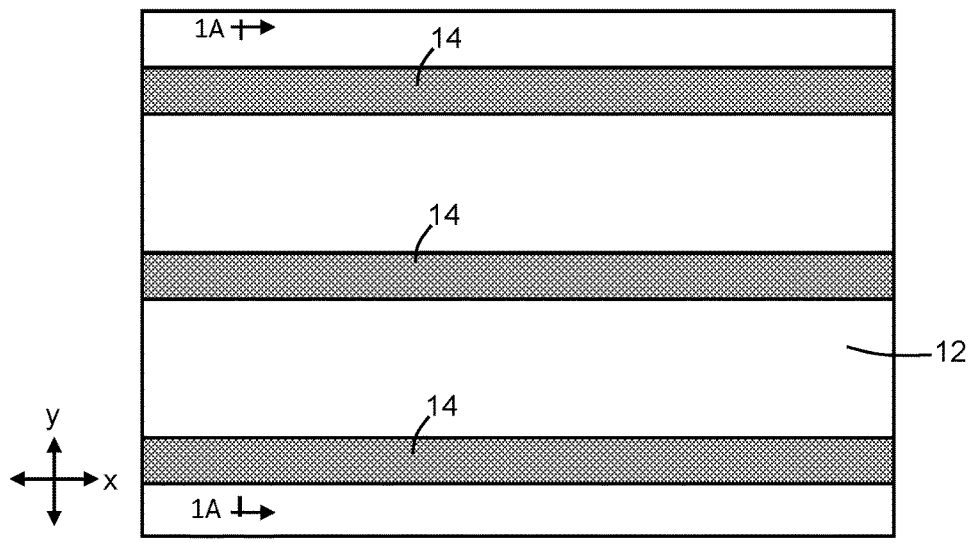
FIGS. 1-5 are top views of a structure at successive stages of a processing method in accordance with embodiments of the invention.
Figure 1A:
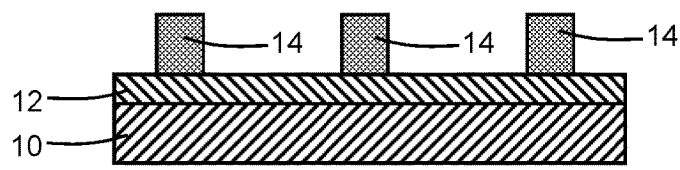
FIG. 1A is a cross-sectional view taken generally along lines 1A-1A in FIG. 1.

With reference to FIGS. 1, 1A and in accordance with embodiments of the invention, an interlayer dielectric layer 10 may be comprised of an electrically-insulating dielectric material, such as hydrogen-enriched silicon oxycarbide (Si-COH) or another type of low-k dielectric material. The interlayer dielectric layer 10 may be located on a substrate that includes device structures fabricated by front-end-of-line (FEOL) processing to form an integrated circuit.

A hardmask 12 is located on the top surface of the interlayer dielectric layer 10. The hardmask 12 may be comprised of a metal, such as titanium nitride (TiN), deposited by physical vapor deposition (PVD) and/or a dielectric material, such as silicon nitride ($Si_3N_4$), deposited by chemical vapor deposition (CVD). The hardmask 12 is removable from the interlayer dielectric layer 10 selective to the material of the interlayer dielectric layer 10. As used herein, the term "selective" in reference to a material removal process (e.g., etching) denotes that the material removal rate (i.e., etch rate) for the targeted material is higher than the material removal rate (i.e., etch rate) for at least another material exposed to the material removal process.

Mandrels 14 are formed on a top surface of the hardmask 12. The mandrels 14 may be concurrently formed by depositing a blanket layer of a sacrificial material (e.g., amorphous silicon) on the entire top surface of the hardmask 12 and patterning the blanket layer by lithography and etching using a lithography stack. The mandrels 14 have a lengthwise parallel arrangement and extend with a length in a given direction (e.g., an x-direction in an x-y coordinate frame). The mandrels 14 have a width in a given direction (e.g., a y-direction in an x-y coordinate frame) that is transverse of the lengthwise direction.

Figure 2:
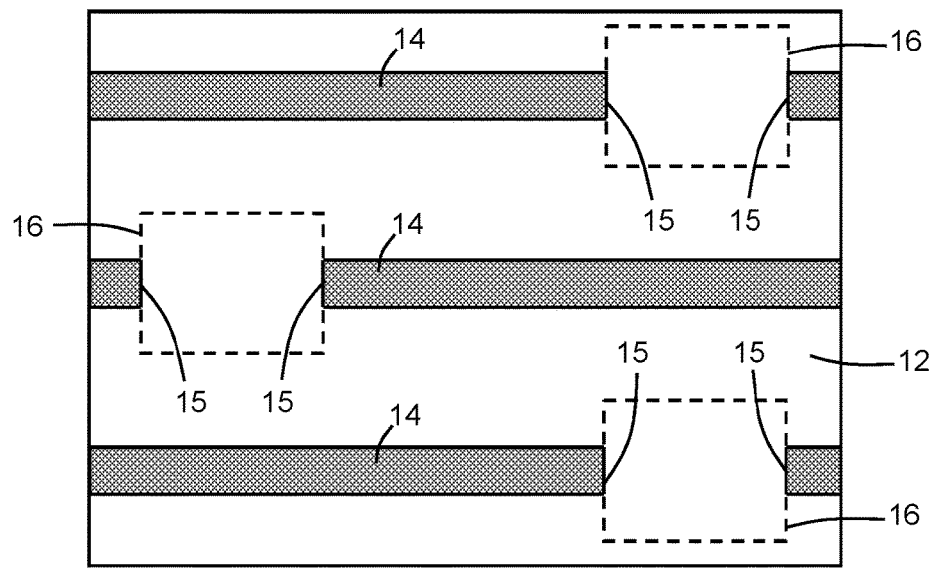

With reference to FIG. 2 in which like reference numerals refer to like features in FIG. 1 and at a subsequent fabrication stage of the processing method, mandrel cuts 16 are formed in the mandrels 14 by applying a cut mask (not shown) and etching to cut the mandrels 14 into distinct sections at respective locations along their lengths. The cut mask may include a photoresist layer that is patterned by exposure to a pattern of radiation from an exposure source projected through a photomask, and developed with a chemical developer to form openings that are situated at the intended locations for the mandrel cuts 16. Sections of the mandrels 14 are removed to form the mandrel cuts 16 at the locations of the openings in the cut mask using an etching process, such as reactive-ion etching (RIE), that is selective to the material of the hardmask 12.

The mandrel cuts 16 expose respective areas on the top surface of the hardmask 12 from which the mandrels 14 are removed. The mandrel cuts 16 are staggered such that their locations vary along the length of adjacent mandrels 14. The mandrel cuts 16 form gaps of a given width between adjacent ends 15 of the cut mandrels 14.

Figure 3:
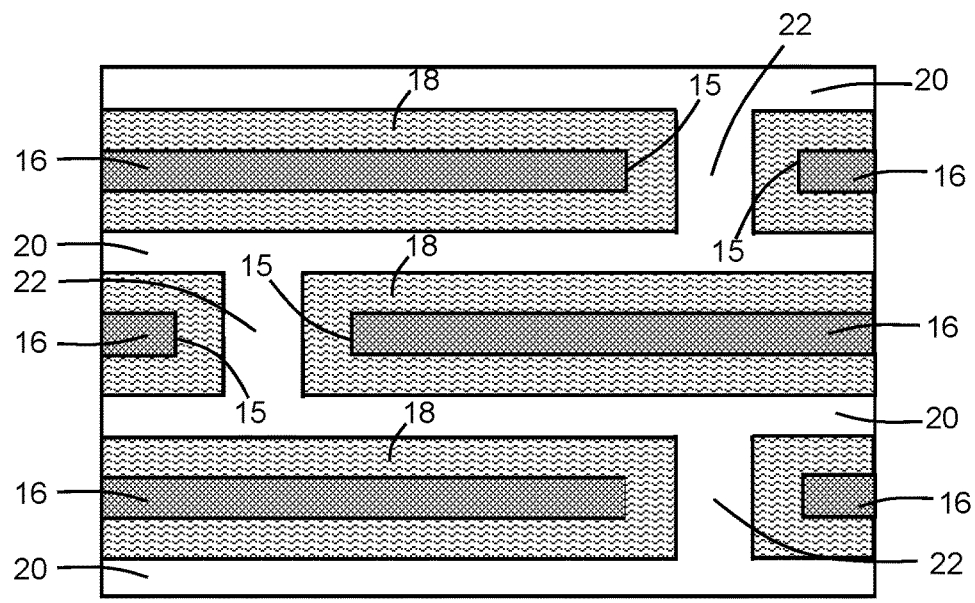

With reference to FIG. 3 in which like reference numerals refer to like features in FIG. 2 and at a subsequent fabrication stage of the processing method, sidewall spacers 18 are formed at locations on the top surface of the hardmask 12 adjacent to the vertical sidewalls of the mandrels 14. The sidewall spacers 18 may be formed by depositing a conformal layer on the mandrels 14 and the top surface of hardmask 12 where exposed by the mandrels 14, and shaping the conformal layer with an anisotropic etching process, such as reactive ion etching (RIE). The sidewall spacers 18 may be comprised of a dielectric material, such as silicon dioxide ($SiO_2$)) deposited by atomic layer deposition (ALD). The materials constituting the mandrels 14 and the sidewall spacers 18 are selected such that the mandrels 14 may be removed selective to the material of the sidewall spacers 18 through the use of a suitable etch chemistry.

Non-mandrel lines 20 of the hardmask 12 are arranged parallel to the mandrels 14 and between the adjacent pairs of the sidewall spacers 18 as areas of top surface of the hardmask 12 that are not covered by the mandrels 14 and sidewall spacers 18. The sidewall spacers 18 also form adjacent to the ends 15 of the mandrels 14 and extend across the gaps between the cut mandrels 14.

The mandrel cuts 16 (FIG. 2) are dimensioned and the sidewall spacers 18 have a thickness such that non-mandrel spaces 22 are arranged as areas between the sidewall spacers 18 on the ends 15 of the mandrels 14. Dimensional parameters for the mandrel cuts 16 and sidewall spacers 18 may be selected to ensure a minimum end-to-end distance between the facing ends 15 of the cut mandrels 14. The non-mandrel spaces 22 not filled and covered by the sidewall spacers 18, and extend laterally to connect adjacent non-mandrel lines 20.

In an embodiment, the width of the mandrel cuts 16 (FIG. 2) may be greater than or equal to 70 nanometers, which is greater than conventional design rules. The larger than conventional width is required to provide adequate space for the formation of the sidewall spacers 18 while forming non-mandrel spaces 22 of adequate size. For example, the width of the sidewall spacers 18 may range from 15 nanometers to 25 nanometers, which coupled with mandrel cuts 16 that are greater than or equal to 70 nanometers leads to non-mandrel spaces 22 having a width of greater than or equal to 15 nanometers. The width of the non-mandrel spaces 22 is reflected in the subsequent formation of connection interconnects of the same width using the non-mandrel spaces 22.

Figure 4:
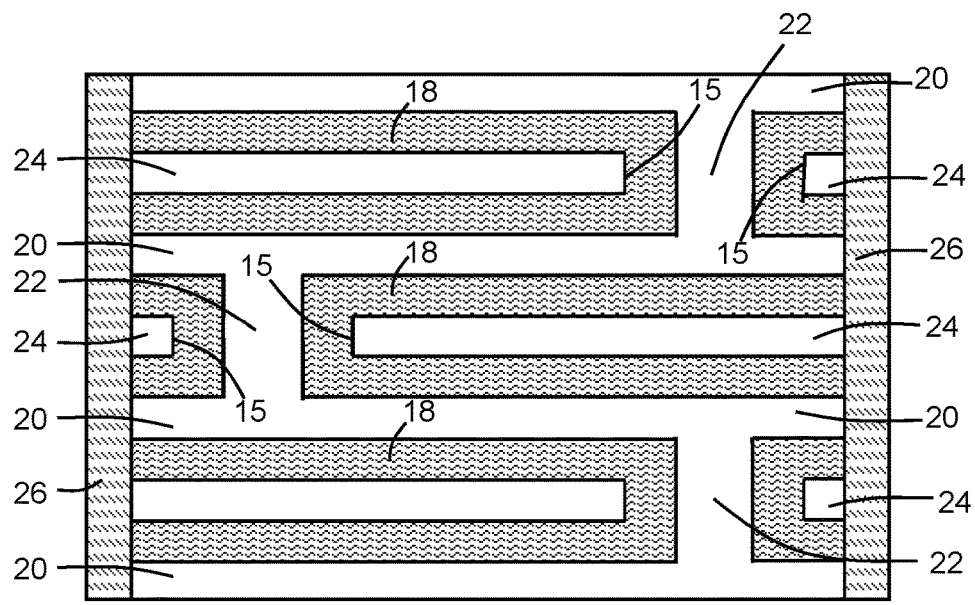

With reference to FIG. 4 in which like reference numerals refer to like features in FIG. 3 and at a subsequent fabrication stage of the processing method, the mandrels 14 are removed selective to the sidewall spacers 18 with an etching process having a suitable etch chemistry. The hardmask 12 is exposed in mandrel lines 24 over areas from which the mandrels 14 are pulled by the etching process. The sidewall spacers 18 are arranged in U-shaped patterns on the top surface of the hardmask 12 in which the non-mandrel spaces 22 define breaks in the continuity of the sidewall spacers 18 and mandrel lines 24. Termination blocks 26 are formed at the edges of the pattern of sidewall spacers 18, non-mandrel lines 20, non-mandrel spaces 22, and mandrel lines 24.

Figure 5:
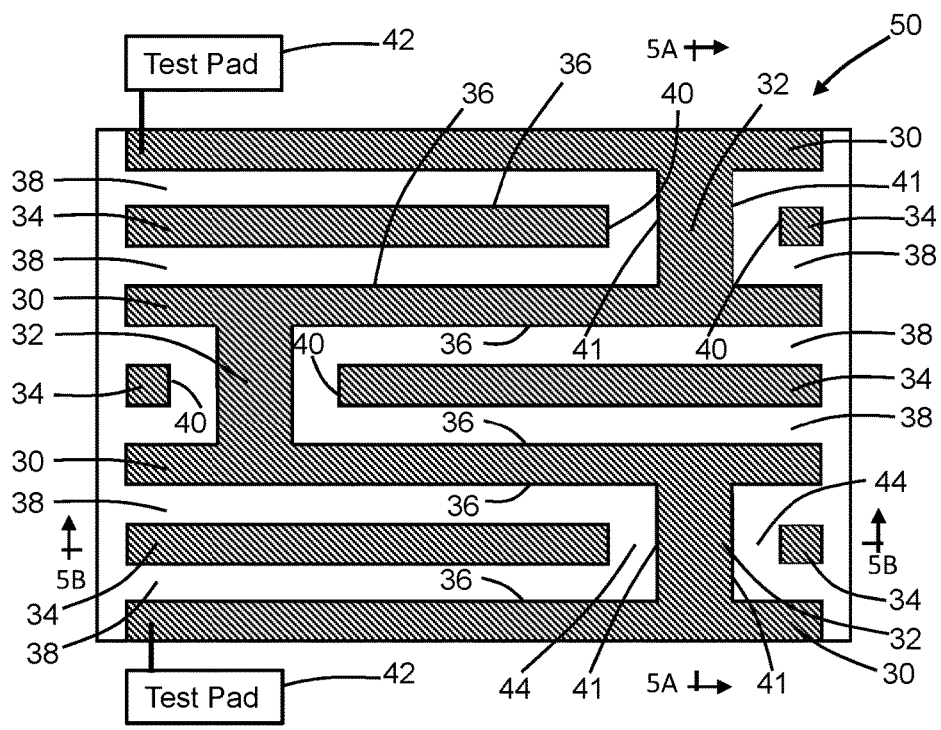
Figure 5A:
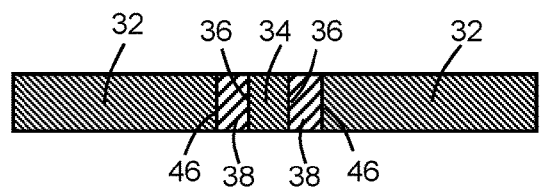
FIG. 5A is a cross-sectional view taken generally along lines 5A-5A in FIG. 5.
Figure 5B:
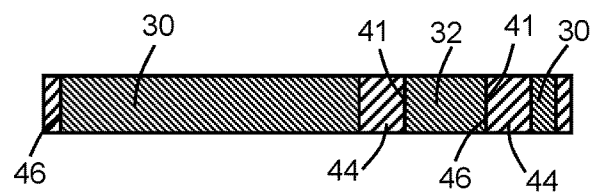
FIG. 5B is a cross-sectional view taken generally along lines 5B-5B in FIG. 5.

With reference to FIGS. 5, 5A, 5B in which like reference numerals refer to like features in FIG. 4 and at a subsequent fabrication stage of the processing method, after the mandrels 14 are removed and the termination blocks 26 are formed, the hardmask 12 is patterned by an etching process with the sidewall spacers 18 operating as an etch mask. The hardmask 12 is removed over the exposed areas corresponding to non-mandrel lines 20, non-mandrel spaces 22, and mandrel lines 24. Areas of the hardmask 12 covered by the sidewall spacers 18 and the termination blocks 26 are preserved and retained during the etching of the hardmask 12. The result of the hardmask patterning is that the pattern of non-mandrel lines 20, non-mandrel spaces 22, and mandrel lines 24 is transferred to the hardmask 12. The interlayer dielectric layer 10 is exposed over areas corresponding to the non-mandrel lines 20, non-mandrel spaces 22, and mandrel lines 24 and is masked over areas covered by the sidewall spacers 18 and termination blocks 26.

The interlayer dielectric layer 10 is etched using the hardmask 12 as a patterned etch mask to pattern the interlayer dielectric layer 10 and thereby form trenches 46 in the interlayer dielectric layer 10 at the locations of the non-mandrel lines 20, non-mandrel spaces 22, and over mandrel lines 24. After the interlayer dielectric layer 10 is etched, the patterned hardmask 12 may be selectively removed by one or more etching or cleaning processes. The sidewall spacers 18 may be removed along with the patterned hardmask 12 after the interlayer dielectric layer 10 is etched, or before the interlayer dielectric layer 10 is etched.

A back-end-of-line (BEOL) interconnect structure 50 is formed by filling the trenches 46 in the interlayer dielectric layer 10 with a conductor to form non-mandrel interconnects 30, connector interconnects 32, and mandrel interconnects 34 as features embedded in the interlayer dielectric layer 10. A liner (not shown) comprised of titanium (Ti), titanium nitride (TiN), tantalum (Ta), tantalum nitride (TaN), or a layered combination of these materials (e.g., a bilayer of TaN/Ta) may be applied to the trenches before filling with the primary electrical conductor. The primary conductor may be comprised of a low-resistivity metal formed using a deposition process, such as copper (Cu) formed by electroplating or electroless deposition. The shapes and geometries of the interconnects 30, 32, and 34 reflect the areas exposed for trench formation in the interlayer dielectric layer 10 by the patterned hardmask 12. In an embodiment, the interconnects 30, 32, and 34 may be conductive features located in a first metallization (M0) level that is the closest of multiple metallization levels of the BEOL interconnect structure 50 to FEOL device structures, and in which the interconnects 30, 32, and 34 may be connected with FEOL device structures by vertical contacts in a contact (CA) level. In an embodiment, the interconnects 30, 32, and 34 may have a width that is less than 45 nanometers.

The interconnects 30 and 32 are arranged as linear conductive features that are oriented in the same direction and have a parallel alignment relative to each other. The interconnects 30 and 32 are separated by spaces 38 defined over areas formerly covered by the sidewall spacers 18 on the hardmask 12. The spaces 38 are linear sections of the dielectric material of the interlayer dielectric layer 10. The interconnects 30 and 32 are terminated over areas formerly covered by the termination blocks 26 on the hardmask 12. The non-mandrel interconnects 30 are placed at the former locations of the non-mandrel lines 20 opened in the hardmask 12 over corresponding areas, and the mandrel interconnects 34 are placed at the former locations of the mandrel lines 24 opened in the hardmask 12 over corresponding areas. Each of the non-mandrel interconnects 30 has side surfaces 36, and each of the mandrel interconnects 34 has end surfaces 40.

The connector interconnects 32 are arranged as linear conductive features that are aligned transverse to the non-mandrel interconnects 30 and aligned transverse to the mandrel interconnects 34. The connector interconnects 32 are placed at the former locations of the non-mandrel spaces 22, which are opened in the hardmask 12 with equal areas. Each of the connector interconnects 32 has side surfaces 41 that extend from the side surface 36 of one of the non-mandrel interconnects 30 to the side surface 36 of another of the non-mandrel interconnects 30 in which the connected non-mandrel interconnects 30 are parallel and adjacent. The connector interconnects 32 extend laterally between the non-mandrel interconnects 30 through end-to-end gaps between the end surfaces 40 of the mandrel interconnects 34 that are the product of the wide mandrel cuts 16. The end-to-end distance between the end surfaces 40 of the mandrel interconnects 34 is greater than or equal to 70 nanometers. The side surfaces 41 are located between the end surfaces 40 such that the width of the connector interconnects 32 is less than the end-to-end gap. The width of the connector interconnects 32 between the side surfaces 41 is greater than or equal to 15 nanometers. Portions 44 of the interlayer dielectric layer 10 are located between the connector interconnects 32 and the end surface 40 of the mandrel interconnects 34. These portions 44 have respective widths given by one-half of the difference between the end-to-end distance between the end surfaces 40 and the width of the connector interconnects 32.

The connector interconnects 32 connect the non-mandrel interconnects 30 to define a continuous serpentine line that winds back and forth with changes in direction provided by the connector interconnects 32. The connector interconnects 32 provide the changes in direction needed for the continuous serpentine line. Although the embodiments of the invention are not so limited, the interconnects 30, 32, and 34 may be used as a test structure by connecting the terminating ends of the non-mandrel interconnects 30 with test pads 42. The test pads 42 may be located at the ends of non-mandrel interconnects 30 that are opposite to the ends with the end surfaces 40. The test pads 42 may be formed by deposition and etching in an uppermost metallization level of the BEOL interconnect structure.

The test structure may be used to test for open circuits in the M0 metallization level. To that end, a signal may be launched into the test structure using one of the test pads 42 and the output from the test structure will appear at the other of the test pads 42. If the interconnects 30, 32, and 34 have an open circuit due to a manufacturing defect, then an output may be absent.

For advanced technology nodes, BEOL processing may apply self-aligned multiple patterning (i.e., self-aligned multi-patterning) in the form of self-aligned double patterning (SADP) or self-aligned quaduple patterning (SAQP) and self-aligned cuts for multiple metal patterning. A deficiency of conventional multi-patterning techniques is that the associated design rules only support unidirectional metal lines without any exception for wrong way design. Consequently, a conventional test structure used to detect open circuits in a metallization level (e.g., the M0 metallization level) must connect the unidirectional metal lines through metallization in overlying via and wiring levels to provide the connections for the unidirectional metal lines. Multiple additional lithography layers must be completed to form conventional test structures used to test for open circuits in the metallization level of interest. In addition, the test measurement based on conventional test structures may be affected by additional variables, such as opens, overlay, and process issues in overlying via and wiring levels as artifacts.

The arrangement of interconnects 30, 32, and 34 relies on a wide mandrel cut in the formation of the connector interconnects 32 that enable an at-level continuous serpentine line in a metallization level, such as the M0 metallization level. The arrangement of interconnects 30, 32, and 34 eliminates the conventional need to provide lateral connections in a direction to otherwise unidirectional (i.e., strictly parallel) lines through metallization in overlying via and wiring levels. The arrangement of interconnects 30, 32, and 34 enables bidirectional self-aligned multiple patterning (i.e., SADP and SAQP), and significantly reduces design limitations for BEOL interconnects imposed by unidirectional patterning during multiple patterning.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A self-aligned multi-patterning structure comprising:
    an interlayer dielectric layer;
    a first non-mandrel interconnect embedded in the interlayer dielectric layer, the first non-mandrel interconnect having a side surface that extends in a first direction;
    a second non-mandrel interconnect embedded in the interlayer dielectric layer, the second non-mandrel interconnect having a side surface that extends in the first direction; and a connector interconnect extending in a second direction transverse to the first direction from the side surface of the first non-mandrel interconnect to the side surface of the second non-mandrel interconnect.

2. The self-aligned multi-patterning structure of claim 1 further comprising:
a first mandrel interconnect; and
a second mandrel interconnect,
wherein the first mandrel interconnect and the second mandrel interconnect are laterally arranged in the interlayer dielectric layer between the side surface of the first non-mandrel interconnect and the side surface of the second non-mandrel interconnect.

3. The self-aligned multi-patterning structure of claim 2 wherein the first mandrel interconnect has an end surface, the second mandrel interconnect has an end surface spaced from the end surface of the first mandrel interconnect by a gap, and the connector interconnect extends through the gap between the side surface of the first non-mandrel interconnect and the side surface of the second non-mandrel interconnect.

4. The self-aligned multi-patterning structure of claim 3 wherein a first portion of the interlayer dielectric layer is located between the connector interconnect and the end surface of the first mandrel interconnect, and a second portion of the interlayer dielectric layer is located between the connector interconnect and the end surface of the first mandrel interconnect.

5. The self-aligned multi-patterning structure of claim 4 wherein the gap has an end-to-end distance between the end surface of the first mandrel interconnect and the end surface of the second mandrel interconnect, the connector interconnect has a first width, and the first portion of the interlayer dielectric layer and the second portion of the interlayer dielectric layer have a second width given by one-half of a difference between the end-to-end distance and the first width.

6. The self-aligned multi-patterning structure of claim 3 wherein the gap has an end-to-end distance between the end surface of the first mandrel interconnect and the end surface of the second mandrel interconnect, and the end-to-end distance is greater than or equal to 70 nanometers.

7. The self-aligned multi-patterning structure of claim 6 wherein the connector interconnect is embedded in the interlayer dielectric layer between the side surface of the first non-mandrel interconnect and the side surface of the second non-mandrel interconnect.

8. The self-aligned multi-patterning structure of claim 1 wherein the connector interconnect has a width that is greater than or equal to 15 nanometers.

9. The self-aligned multi-patterning structure of claim 1 wherein the first non-mandrel interconnect, the second non-mandrel interconnect, and the connector interconnect are arranged in a first metallization (M0) level.

10. The self-aligned multi-patterning structure of claim 1 further comprising:
a test pad connected with the first non-mandrel interconnect.

11. A method of forming a self-aligned multi-patterning structure, the method comprising:
forming a first non-mandrel interconnect and a second non-mandrel interconnect in an interlayer dielectric layer, wherein the first non-mandrel interconnect has a side surface that extends in a first direction and the second non-mandrel interconnect has a side surface that extends in the first direction; and
forming a connector interconnect in the interlayer dielectric layer that extends in a second direction transverse to the first direction from the side surface of the first non-mandrel interconnect to the side surface of the second non-mandrel interconnect.

12. The method of claim 11 further comprising:
forming a first mandrel interconnect and a second mandrel interconnect arranged between the side surface of the first non-mandrel interconnect and the side surface of the second non-mandrel interconnect,
wherein the connector interconnect extend surfaces through a gap between an end surface of the first mandrel interconnect and an end surface of the second mandrel interconnect.

13. The method of claim 12 wherein the gap has a width that is greater than or equal to 70 nanometers.

14. The method of claim 11 further comprising:
forming a mandrel on the interlayer dielectric layer;
forming a cut in the mandrel to define a first cut mandrel with a first end surface and a second cut mandrel with a second end surface separated from the first end surface by a gap; and
transferring a portion of the cut to the interlayer dielectric layer with an etching process to form a first trench,
wherein the connector interconnect is formed by filling the first trench with a conductor.

15. The method of claim 14 further comprising:
forming a first sidewall spacer on the first end surface of the first cut mandrel; and
forming a second sidewall spacer on the second end surface of the second cut mandrel,
wherein the second sidewall spacer is spaced from the first sidewall spacer by a non-mandrel space.

16. The method of claim 15 wherein the interlayer dielectric layer is etched by the etching process over an area of the non-mandrel space to form the first trench.

17. The method of claim 15 wherein the first sidewall spacer is further formed on opposite side surfaces of the first cut mandrel, and forming the first non-mandrel interconnect and the second non-mandrel interconnect in the interlayer dielectric layer comprises:
forming a second trench and a third trench in the interlayer dielectric layer over respective areas separated from each other by the first cut mandrel and the first sidewall spacer on the opposite side surfaces of the first cut mandrel; and
filling the second trench and the third trench with the conductor to respectively form the first non-mandrel interconnect and the second non-mandrel interconnect.

18. The method of claim 14 wherein the gap has a width that is greater than or equal to 70 nanometers.

19. The method of claim 14 wherein the first trench has a width that is greater than or equal to 15 nanometers.

20. The method of claim 11 further comprising:
connecting the first non-mandrel interconnect with a test pad.

* * * * *